United States Patent
Kim et al.

(10) Patent No.: US 10,438,655 B2
(45) Date of Patent: Oct. 8, 2019

(54) APPARATUSES AND METHODS OF DISTRIBUTING ADDRESSES IN MEMORY DEVICES FOR MITIGATING WRITE DISTURBANCE

(71) Applicant: SK hynix Inc., Icheon-si, Gyeonggi-do (KR)

(72) Inventors: Donggun Kim, Hwaseong-si (KR); Jung Hyun Kwon, Seoul (KR); Yong Ju Kim, Seoul (KR); Do Sun Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/822,718

(22) Filed: Nov. 27, 2017

(65) Prior Publication Data
US 2018/0308542 A1    Oct. 25, 2018

(30) Foreign Application Priority Data
Apr. 21, 2017    (KR) .................. 10-2017-0051543

(51) Int. Cl.
| | | |
|---|---|---|
| *G11C 11/00* | (2006.01) | |
| *G11C 11/56* | (2006.01) | |
| *G11C 16/04* | (2006.01) | |
| *G11C 16/10* | (2006.01) | |
| *G11C 7/10* | (2006.01) | |
| *G06F 12/02* | (2006.01) | |
| *G11C 16/08* | (2006.01) | |
| *G11C 13/00* | (2006.01) | |
| *G11C 16/34* | (2006.01) | |
| *G11C 7/12* | (2006.01) | |
| *G11C 8/08* | (2006.01) | |

(52) U.S. Cl.
CPC ...... *G11C 11/5628* (2013.01); *G06F 12/0246* (2013.01); *G11C 7/1006* (2013.01); *G11C 13/0023* (2013.01); *G11C 13/0069* (2013.01); *G11C 16/0483* (2013.01); *G11C 16/08* (2013.01); *G11C 16/10* (2013.01); *G11C 16/3427* (2013.01); *G11C 7/12* (2013.01); *G11C 8/08* (2013.01); *G11C 11/5642* (2013.01)

(58) Field of Classification Search
CPC ... G11C 11/5628; G11C 16/08; G11C 7/1006; G11C 16/10; G11C 16/0483; G11C 11/5642; G06F 12/0246
USPC ...................................... 365/185.03
See application file for complete search history.

(56) References Cited

U.S. PATENT DOCUMENTS

| | | | | |
|---|---|---|---|---|
| 2013/0248814 A1* | 9/2013 | Hou | .......... | H01L 27/2418 257/5 |
| 2017/0084323 A1* | 3/2017 | Andre | ............ | G11C 11/1673 |

FOREIGN PATENT DOCUMENTS

KR    1020090118060 A    11/2009

* cited by examiner

*Primary Examiner* — Huan Hoang
(74) *Attorney, Agent, or Firm* — William Park & Associates Ltd.

(57) ABSTRACT

An address distribution apparatus includes an address distributor. The address distributor distributes addresses of a plurality of memory cells in a memory device to prevent at least two successive write operations from being applied to at least two adjacent memory cells sharing any one of a plurality of word lines or any one of a plurality of bit lines among the plurality of memory cells. The at least two write operations are performed in response to write requests outputted from a host, respectively.

16 Claims, 8 Drawing Sheets

FIG.3

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| row |||||| bank ||| offset ||||||
| Word Line ||| Bit Line ||| | | | | | | | | | |

FIG.4

| | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 8 | 9 | 10 | 11 | 12 | 13 | 14 | 15 |
| 2 | 16 | 17 | 18 | 19 | 20 | 21 | 22 | 23 |
| 3 | 24 | 25 | 26 | 27 | 28 | 29 | 30 | 31 |
| 4 | 32 | 33 | 34 | 35 | 36 | 37 | 38 | 39 |
| 5 | 40 | 41 | 42 | 43 | 44 | 45 | 46 | 47 |
| 6 | 48 | 49 | 50 | 51 | 52 | 53 | 54 | 55 |
| 7 | 56 | 57 | 58 | 59 | 60 | 61 | 62 | 63 |

BIT LINE INDEX (Ib)

ROW INDEX (Ir)

WORD LINE INDEX (Iw)

FIG.5

|  | JUMP INDEX (J) | | | | | |
|---|---|---|---|---|---|---|
|  | 9 | 11 | 13 | 15 | 17 | 19 |
| 0 | 0 | 0 | 0 | 0 | 0 | 0 |
| 1 | 9 | 11 | 13 | 15 | 17 | 19 |
| 2 | 18 | 22 | 26 | 30 | 34 | 38 |
| 3 | 27 | 33 | 39 | 45 | 51 | 57 |
| 4 | 36 | 44 | 52 | 60 | 4 | 12 |
| 5 | 45 | 55 | 1 | 11 | 21 | 31 |
| 6 | 54 | 2 | 14 | 26 | 38 | 50 |
| 7 | 63 | 13 | 27 | 41 | 55 | 5 |
| 8 | 8 | 24 | 40 | 56 | 8 | 24 |
| 9 | 17 | 35 | 53 | 7 | 25 | 43 |
| 10 | 26 | 46 | 2 | 22 | 42 | 62 |
| 11 | 35 | 57 | 15 | 37 | 59 | 17 |
| 12 | 44 | 4 | 28 | 52 | 12 | 36 |
| 13 | 53 | 15 | 41 | 3 | 29 | 55 |
| 14 | 62 | 26 | 54 | 18 | 46 | 10 |
| 15 | 7 | 37 | 3 | 33 | 63 | 29 |
| ⋮ | ⋮ | ⋮ | ⋮ | ⋮ | ⋮ | ⋮ |
| 63 | 55 | 53 | 51 | 49 | 47 | 45 |

ROW INDEX (Ir) BEFORE ADDRESS DISTRIBUTION

ROW INDEX (Mr) AFTER ADDRESS DISTRIBUTION

FIG.6

| | 0 | 1 | 2 | 3 | 4 | 5 | 6 | 7 |
|---|---|---|---|---|---|---|---|---|
| 0 | 0 | 57 | 50 | 43 | 36 | 29 | 22 | 15 |
| 1 | 8 | 1 | 58 | 51 | 44 | 37 | 30 | 23 |
| 2 | 16 | 9 | 2 | 59 | 52 | 45 | 38 | 31 |
| 3 | 24 | 17 | 10 | 3 | 60 | 53 | 46 | 39 |
| 4 | 32 | 25 | 18 | 11 | 4 | 61 | 54 | 47 |
| 5 | 40 | 33 | 26 | 19 | 12 | 5 | 62 | 55 |
| 6 | 48 | 41 | 34 | 27 | 20 | 13 | 6 | 63 |
| 7 | 56 | 49 | 42 | 35 | 28 | 21 | 14 | 7 |

BIT LINE INDEX (Ib)

WORD LINE INDEX (Iw)

ROW INDEX (Mr) AFTER ADDRESS DISTRIBUTION

FIG.7

| | 0 | 1 | 2 | 3 | 4 | 5 | 6 | 7 |
|---|---|---|---|---|---|---|---|---|
| 0 | 0 (W1) | 1 (W2) | 2 (W3) | 3 (W4) | 4 (W5) | 5 (W6) | 6 | 7 |
| 1 | 8 | 9 | 10 | 11 | 12 | 13 | 14 | 15 |
| 2 | 16 | 17 | 18 | 19 | 20 | 21 | 22 | 23 |
| 3 | 24 | 25 | 26 | 27 | 28 | 29 | 30 | 31 |
| 4 | 32 | 33 | 34 | 35 | 36 | 37 | 38 | 39 |
| 5 | 40 | 41 | 42 | 43 | 44 | 45 | 46 | 47 |
| 6 | 48 | 49 | 50 | 51 | 52 | 53 | 54 | 55 |
| 7 | 56 | 57 | 58 | 59 | 60 | 61 | 62 | 63 |

BIT LINE INDEX (Ib)

ROW INDEX (Ir)

WORD LINE INDEX (Iw)

APPARATUSES AND METHODS OF DISTRIBUTING ADDRESSES IN MEMORY DEVICES FOR MITIGATING WRITE DISTURBANCE

CROSS-REFERENCE TO RELATED APPLICATIONS

The present application claims priority under 35 U.S.C 119(a) to Korean Application No. 10-2017-0051543, filed on Apr. 21, 2017, which is incorporated herein by reference.

BACKGROUND

1. Technical Field

Various embodiments of the present disclosure generally relate to apparatuses and methods of distributing addresses in memory devices and, more particularly, to apparatuses and methods of distributing addresses in memory devices for mitigating write disturbance.

2. Related Art

Recently, memory devices using a semiconductor material have been in increasing demand with the development of portable systems such as mobile phones. The memory devices may be typically categorized as either volatile memory devices or nonvolatile memory devices. In particular, since most portable systems tend to employ a large memory capacity, nonvolatile memory devices which retain stored data even when power supply is interrupted have been widely used in various portable systems. The volatile memory devices may include static random access memory (SRAM) devices and dynamic random access memory (DRAM) devices. The nonvolatile memory devices may include ferroelectric random access memory (FeRAM) devices, magnetic random access memory (MRAM) devices, resistive random access memory (RRAM) devices, and phase change memory (PCM) devices.

The PCM devices among the nonvolatile memory devices have been known as attractive nonvolatile memory devices. This is because the PCM devices have a relatively simple cell structure as compared with other nonvolatile memory devices and exhibit a relatively high operation speed like DRAM devices which belong to the volatile memory devices. Furthermore, the PCM devices are very attractive as next generation nonvolatile memory devices because manufacturing costs of the PCM devices are relatively low as compared with other nonvolatile memory devices. A unit cell of PCM devices may be located at a cross point of a word line and a bit line to include a switching element and a data storage element which are coupled in series. The data storage element may include a lower electrode electrically coupled to the switching element, a phase changeable material pattern disposed on the lower electrode, and an upper electrode disposed on the phase changeable material pattern.

In the PCM devices, if a write current flows through the switching element and the lower electrode to perform a write operation, joule heat may be generated at an interface between the lower electrode and the phase changeable material pattern. The joule heat generated at the interface between the lower electrode and the phase changeable material pattern may change a phase of the phase changeable material pattern into an amorphous state or a crystalline state to perform a write operation. While the PCM device operates in a write mode for performing write operations, logical addresses may be inputted to the PCM device and the logical addresses may be changed into physical addresses. If write operations are performed to sequentially write data into a plurality of memory cells physically coupled to a single word line or a single bit line, two adjacent memory cells may be successively written with data. In such a case, joule heat generated in one of the two adjacent memory cells may directly affect the other one of the two adjacent memory cells to cause a write disturbance.

SUMMARY

Various embodiments are directed to apparatuses and methods of distributing addresses in memory devices for mitigating write disturbances.

According to an embodiment, there is provided an apparatus for distributing addresses of a plurality of memory cells in a memory device. The apparatus includes an address distributor. The address distributor distributes addresses of the plurality of memory cells to prevent at least two successive write operations from being applied to at least two adjacent memory cells sharing any one of a plurality of word lines or any one of a plurality of bit lines among the plurality of memory cells. The at least two write operations are performed in response to write requests outputted from a host, respectively.

According to another embodiment, there is provided a method of distributing addresses of a plurality of memory cells in a memory device. The method includes distributing addresses of the plurality of memory cells to prevent at least two successive write operations from being applied to at least two adjacent memory cells sharing any one of a plurality of word lines or any one of a plurality of bit lines among the plurality of memory cells. The at least two write operations are performed in response to write requests outputted from a host, respectively.

BRIEF DESCRIPTION OF THE DRAWINGS

Various embodiments of the present disclosure will become more apparent in view of the attached drawings and accompanying detailed description, in which:

FIG. 3 is a schematic diagram illustrating an example of a sixteen-bit address outputted from a host in a write mode;

FIG. 4 is an index map illustrating a bit line index, a word line index, and a row index corresponding to the sixteen-bit address shown in FIG. 3;

FIG. 5 illustrates a portion of a row index map after an address distribution is obtained by applying various jump indexes to the row index of FIG. 4;

FIG. 6 illustrates a row index map after an address distribution is obtained by applying a jump index of '57' nine to the row indexes of FIG. 4; and FIGS. 7 and 8 are index maps illustrating a process for mitigating a write disturbance using an address distribution scheme when a value of '57' is used as a jump index.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under", or "beneath" another element, the description is intended to convey a relative position relationship, but not used to limit certain cases that the element directly contacts an other element, or cases where at least one intervening element is present therebetween. Accordingly, the terms such as "on", "over", "above", "under", "beneath", "below", and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
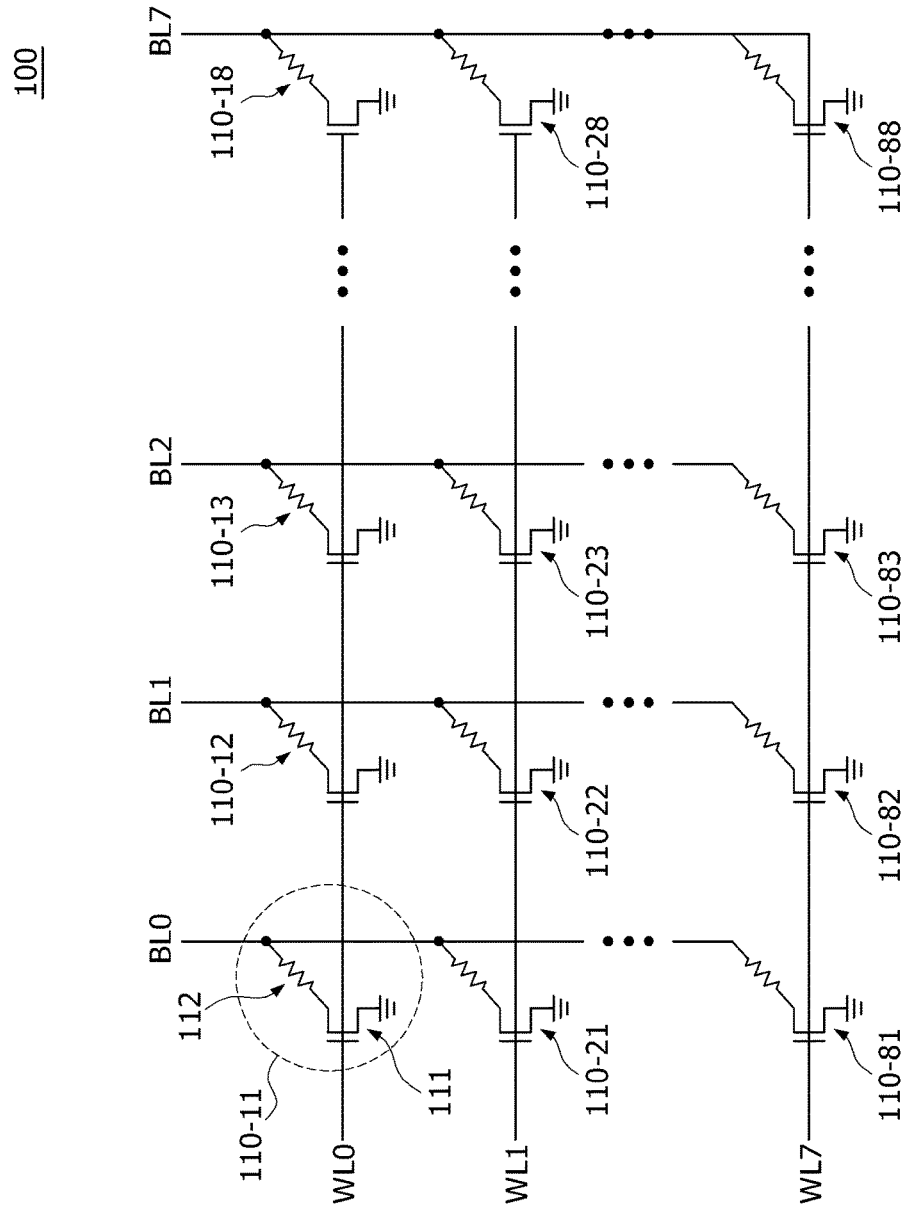
FIG. 1 is an equivalent circuit diagram illustrating a cell array of a phase change memory (PCM) device.

FIG. 1 is an equivalent circuit diagram illustrating a cell array 100 of a phase change memory (PCM) device. Referring to FIG. 1, the cell array 100 may include a plurality of word lines and a plurality of bit lines intersecting the plurality of word lines. In the present embodiment, only eight word lines (i.e., first to eighth word lines WL0-WL7) and only eight bit lines (i.e., first to eighth bit lines BL0-BL7) are illustrated in FIG. 1 for the purpose of ease and convenience of explanation. PCM cells 110 may be located at cross points of the word lines WL0-WL7 and the bit lines BL0-BL7, respectively. Each of the PCM cells 110 may include a switching element 111 and a data storage element 112 which are coupled in series. The switching element 111 may be a MOS transistor having a gate terminal coupled to any one of the word lines WL0-WL7, a drain terminal coupled to the data storage element 112, and a source terminal coupled to a ground terminal. The data storage element 112 may be configured to include a lower electrode, a phase changeable material pattern, and an upper electrode which are sequentially stacked. In such a case, the lower electrode of the data storage element 112 may be coupled to the drain terminal of the switching element 111, and the upper electrode of the data storage element 112 may be coupled to any one of the bit lines BL0-BL7. The PCM cells 110 disposed in the same row may share a single word line (i.e., any one of the word lines WL0-WL7) with each other. For example, the PCM cells 110-11, 110-12, 110-13, ... and 110-18 disposed in a first row may share the first word line WL0 with each other. The PCM cells 110 disposed in the same column may share a single bit line (i.e., any one of the bit lines BL0-BL7) with each other. For example, the PCM cells 110-11, 110-21, ... and 110-81 disposed in a first column may share the first bit line BL0 with each other.

If write operations of the PCM cells 110 sharing the same word line are successively performed, joule heat generated at an interface between the lower electrode and the phase changeable material pattern of any one of the PCM cells 110 may affect the other PCM cells 110 sharing the same word line with the selected PCM cell 110 to cause a write disturbance. Thus, the present embodiment may provide an apparatus for distributing addresses in a memory device so that a write disturbance is mitigated by preventing successive write operations of PCM cells 110 sharing the same word line with an address distribution scheme if successive write operations of PCM cells 110 sharing the same word line are required.

Figure 2:
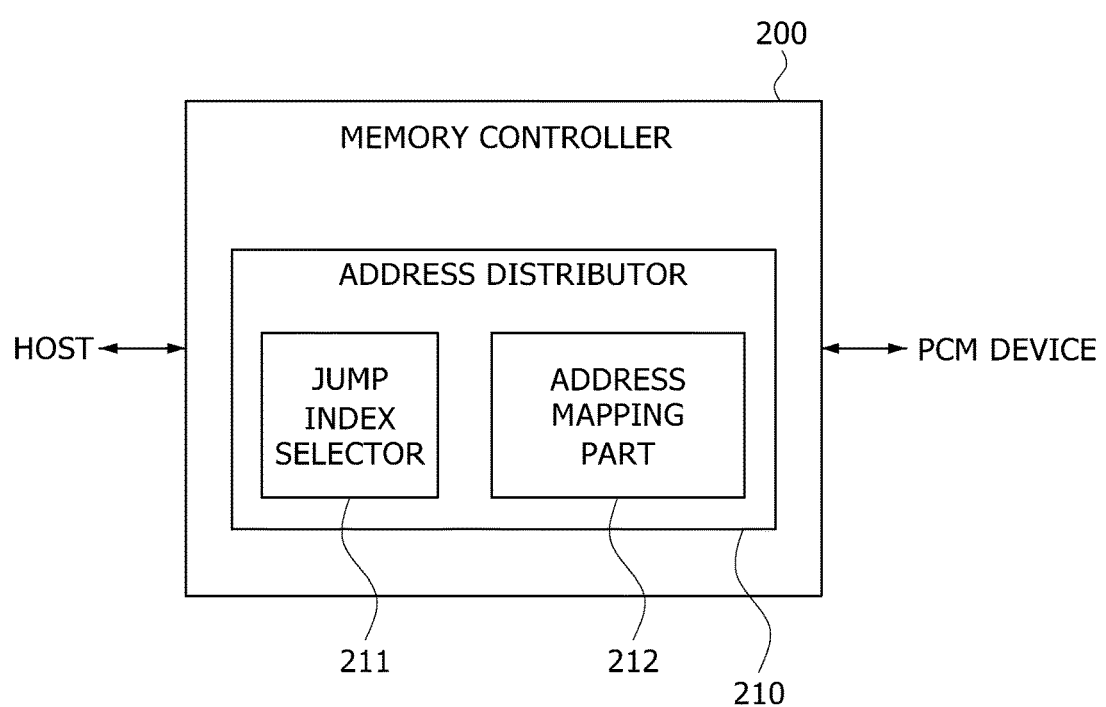
FIG. 2 is a block diagram illustrating a memory system according to an embodiment of the present disclosure.

FIG. 2 is a block diagram illustrating a memory system according to an embodiment of the present disclosure. Referring to FIG. 2, the memory system according to an embodiment may include a memory controller 200 which is coupled between a host and a memory device such as a PCM device to perform control operations. Although the present embodiment is described in conjunction with an example in which a PCM device is used as a memory device, the present disclosure is not limited thereto. That is, the present embodiment may be equally applicable to all memory systems employing memory devices that suffer from write disturbances regardless of whether the memory devices are nonvolatile memory devices or volatile memory devices. The PCM device may include at least one among a plurality of cell arrays including the cell array 100 described with reference to FIG. 1. The memory controller 200 may be configured to include an address distributor 210. Alternatively, the address distributor 210 may be disposed separately from the memory controller 200. The address distributor 210 may distribute addresses of PCM cells to which at least two write operations are successively applied in response to a write request from the host, where the address distributor 210 may prevent the write operations from being sequentially and successively applied to the PCM cells sharing the same word line or the same bit line with each other.

The address distributor 210 may be configured to include a jump index selector 211 and an address mapping part 212. The jump index selector 211 may select a jump index J that is used to distribute addresses of the PCM cells 110. The jump index J may be determined by the number Nb of the bit lines. In an embodiment, the jump index J may be any natural number which is a number greater than the number Nb of bit lines. Further, the number Nb of the bit lines and the jump index J may be coprime. The jump index selector 211 may output the selected natural number to the address mapping part 212. If the number Nb of bit lines is eight as illustrated in FIG. 1, the jump index J may be any one of the natural numbers of 9, 11, 13, 15, 17, . . . . Any one of the natural numbers of 9, 11, 13, 15, 17, . . . is greater than the number of bit lines. Also, any one of the natural numbers of 9, 11, 13, 15, 17, . . . and the number of bit lines may be a coprime. The jump index selector 211 may select one of the natural numbers 9, 11, 13, 15, 17, . . . as the jump index J. In such a case, the jump index selector 211 may randomly select one of the natural numbers 9, 11, 13, 15, 17, . . . as the jump index J.

The address mapping part 212 may perform an address distribution operation using the jump index J selected by the jump index selector 211. In such a case, the address distribution operation may be performed so that the word lines or the bit lines coupled to the PCM cells selected by at least two successive write operations are separate word lines or separate bit lines without duplication. In an embodiment, the address distribution operation executed by the address mapping part 212 for calculating row indexes may be performed based on the following equation 1.

$$Mr = (Ir \times J) \bmod Nr \qquad \text{(Equation 1)}$$

In equation 1, "Mr" denotes a row index after the address distribution operation, "Ir" denotes a row index before the address distribution operation, "J" denotes a jump index selected by the jump index selector 211, and "Nr" denotes the total number of rows (i.e., the total number of the PCM cells). In addition, "mod" denotes a modulo operation. According to the modulo operation, a value of "Ir×J" may be employed as the row index Mr after address distribution if the value of "Ir×J" is less than a value of "Nr", and the remainder after dividing the value of "Ir×J" into the value of "Nr" may be employed as the row index Mr after address distribution if the value of "Ir×J" is greater than the value of "Nr". According to equation 1, the row index Mr after address distribution may be determined by the jump index J, the row index Ir before the address distribution operation is set by indexing the address of each of the PCM cells, and the total number Nr of rows. The row index Mr after the address distribution is calculated by equation 1 may be used in the address distribution operation for preventing successive write operations of PCM cells sharing the same word line or the same bit line with each other.

The address distribution operation for mitigating the write disturbance of the memory device will be described more fully hereinafter.

FIG. 3 is a schematic diagram illustrating an example of a sixteen-bit address outputted from the host in a write mode. Referring to FIG. 3, the sixteen-bit address may be inputted to the memory controller (200 of FIG. 2) to perform write operations of the PCM device according to a write request from the host. The sixteen-bit address may include a six-bit offset address, a four-bit bank address, and a six-bit row address. The six-bit row address may include a three-bit bit line address and a three-bit word line address. The three-bit bit line address may selectively be assigned one of $2^3$ bit lines, that is, eight bit lines. The three-bit word line address may selectively be assigned one of $2^3$ word lines, that is, eight word lines.

FIG. 4 is an index map illustrating a bit line index Ib, a word line index Iw, and a row index Ir corresponding to the sixteen-bit address shown in FIG. 3. Referring to FIG. 4, each of the bit line address and the word line address included in the sixteen-bit address shown in FIG. 3 may be comprised of a three-bit binary stream. Thus, the number Nw of the word lines and the number Nb of the bit lines may be eight. The word line index Iw may be defined as a decimal number of at least any one of the word line addresses. In addition, the bit line index Ib may be defined as a decimal number of at least any one of the bit line addresses. Accordingly, the word line index Iw of the three-bit word line address may have one among the values of 0, 1, 2, 3, 4, 5, 6, and 7. Similarly, the bit line index Ib of the three-bit bit line address may have one among the values of 0, 2, 3, 4, 5, 6, and 7. Because the PCM cells are respectively located at cross points of the word lines and the bit lines, the total number Nr of the PCM cells may be sixty-four. The row index Ir may be defined by the following equation 2.

$$Ir = (Nb \times Iw) + Ib \qquad \text{(Equation 2)}$$

In the equation 2, "Nb" denotes the number of the bit lines. In case of the sixteen-bit address illustrated in FIG. 3, the number Nb of bit lines may be eight because the bit line address is comprised of three bits. In equation 2, "Iw" denotes the word line index, and "Ib" denotes the bit line index. For example, if both the word line index Iw and the bit line index Ib are zero, the row index Ir may be zero according to the equation 2. In addition, if the word line index Iw is zero and the bit line index Ib is one, the row index Ir may be one according to equation 2. As such, the row indexes Ir of the sixty-four PCM cells may be determined by equation 2, as illustrated in FIG. 4. The row indexes Ir of the sixty-four PCM cells may include integer numbers from zero to sixty-three.

FIG. 5 illustrates a portion of a row index map after the address distribution is obtained by applying various jump indexes J to the row index Ir of FIG. 4. Referring to FIG. 5, if the number Nb of the bit lines is eight, the jump index J may be any one among the natural numbers (i.e., 9, 11, 13, 15, 17, . . . ) which are greater than eight and may also be a coprime with eight. The jump index J for performing the address distribution operation may be randomly selected from among the natural numbers of 9, 11, 13, 15, 17, . . . .

If a jump index J of '9' is applied to the row indexes Ir of 0, 1, 2, . . . and 63 before the address distribution, the row indexes Mr after the address distribution may be calculated to include values of 0, 9, 18, 27, . . . and 55 according to equation 1. If a jump index J of '11' is applied to the row indexes Ir of 0, 1, 2, . . . and 63 before the address distribution, the row indexes Mr after the address distribution may be calculated to include values of 0, 11, 22, 33, . . . and 53 according to equation 1. If a jump index J of '13' is applied to the row indexes Ir of 0, 1, 2, . . . and 63 before the address distribution, the row indexes Mr after the address distribution may be calculated to include values of 0, 13, 26, 39, . . . and 51 according to equation 1. If a jump index J of '15' is applied to the row indexes Ir of 0, 1, 2, . . . and 63 before the address distribution, the row indexes Mr after the address distribution may be calculated to include values of 0, 15, 30, 45, . . . and 49 according to equation 1. If a jump index J of '17' is applied to the row indexes Ir of 0, 1, 2, . . . and 63 before the address distribution, the row indexes Mr after the address distribution may be calculated to include values of 0, 17, 34, 51, . . . and 47 according to equation 1. If a jump index J of '19' is applied to the row indexes Ir of 0, 1, 2, . . . and 63 before the address distribution, the row indexes Mr after the address distribution may be calculated to include values of 0, 19, 38, 57, . . . and 45 according to equation 1.

FIG. 6 illustrates a row index map after the address distribution is obtained by applying a jump index J of '57' to the row indexes Ir of FIG. 4. As described above, the row indexes Mr after the address distribution may be obtained by equation 1. As illustrated in FIG. 6, if each of the word line index Iw and the bit line index Ib has any value one among the integers from 0 to 7 and the total number Nr of rows (i.e., the total number of the PCM cells) is sixty-four, the row indexes Mr sharing the word line index Iw '0' may include the values of 0, 57, 50, 43, 36, 29, 22, and 15 into which the row indexes Ir of 0, 1, 2, 3, 4, 5, 6, and 7 are respectively transformed. In such a case, the row indexes Mr sharing the word line index Iw of '1' may include the values of 8, 1, 58, 51, 44, 37, 30, and 23 into which the row indexes Ir of 8, 9, 10, 11, 12, 13, 14, and 15 are respectively transformed. The remaining row indexes Mr after the address distribution may also be transformed using the same manner as described above.

Figure 8:
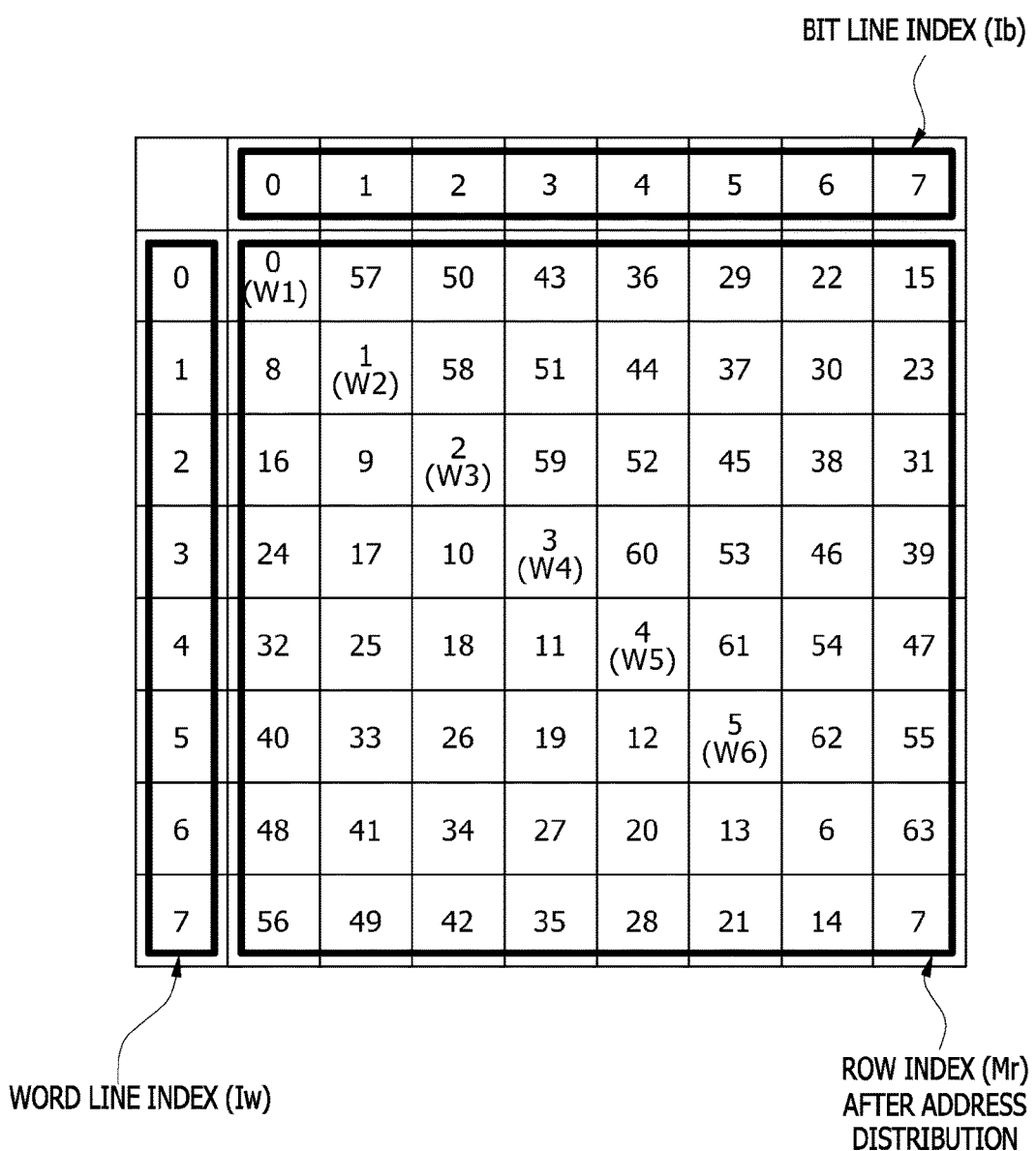

FIGS. 7 and 8 are index maps illustrating a process for mitigating a write disturbance using the address distribution scheme when a value of '57' is used as the jump index J. That is, FIG. 7 is a row index map illustrating write operations performed using the row indexes Ir shown in FIG. 4, and FIG. 8 is a row index map illustrating write operations performed using the row indexes Mr shown in FIG. 6. First, referring to FIG. 7, if first to sixth write requests W1, W2, W3, W4, W5, and W6 in association with the row indexes Ir of 0, 1, 2, 3, 4, and 5 are sequentially outputted from the host, write operations of the PCM cells sharing the first word line (WL0 of FIG. 1) corresponding to the word line index Iw of '0' are sequentially performed because the row indexes Ir have values before the address distribution. That is, write operations in association with the row indexes Ir of 0, 1, 2, 3, 4, 5, 6, and 7 having a word line index Iw of '0' may be successively performed. In such a case, because the PCM cells corresponding to the row indexes Ir of 0, 1, 2, 3, 4, 5, 6, and 7 share the first word line (WL0 of FIG. 1) with each other, a write disturbance may occur during the write operations.

In contrast, as illustrated in FIG. 8, if the address distribution operation is executed by applying a jump index J of '57' to equation 1, the row indexes Ir of 0, 9, 18, 27, 36, and 45 before the address distribution may be respectively transformed into the row indexes Mr of 0, 1, 2, 3, 4, and 5 after the address distribution. Thus, the first write operation executed by the first write request W1 may be performed to write datum into the PCM cell (110-11 of FIG. 1) coupled to the first word line WL0 (corresponding to the word line index Iw of '0') and the first bit line BL0 (corresponding to the bit line index Ib of '0'), and the second write operation executed by the second write request W2 may be performed to write a datum into the PCM cell (110-22 of FIG. 1) coupled to the second word line WL1 (corresponding to the word line index Iw of '1') and the second bit line BL1 (corresponding to the bit line index Ib of '1'). As a result, the PCM cell 110-11 and the PCM cell 110-22 to which the first and second write operations executed by the first and second write requests W1 and W2 are successively applied may be coupled to two different word lines and two different bit lines and do not share the same word line and the same bit line.

The third write operation executed by the third write request W3 may be performed to write a datum into the PCM cell 110-33 coupled to the third word line WL2 (corresponding to the word line index Iw of '2') and the third bit line BL2 (corresponding to the bit line index Ib of '2'). Even in such a case, the PCM cell 110-22 and the PCM cell 110-33 to which the second and third write operations executed by the second and third write requests W2 and W3 are successively applied may be coupled to two different word lines and two different bit lines and do not share the same word line and the same bit line.

The fourth write operation executed by the fourth write request W4 may be performed to write a datum into the PCM cell 110-44 coupled to the fourth word line WL3 (corresponding to the word line index Iw of '3') and the fourth bit line BL3 (corresponding to the bit line index Ib of '3'). Even in such a case, the PCM cell 110-33 and the PCM cell 110-44 to which the third and fourth write operations executed by the third and fourth write requests W3 and W4 are successively applied may be coupled to two different word lines and two different bit lines and do not share the same word line and the same bit line.

The fifth write operation executed by the fifth write request W5 may be performed to write a datum into the PCM cell 110-55 coupled to the fifth word line WL4 (corresponding to the word line index Iw of '4') and the fifth bit line BL4 (corresponding to the bit line index Ib of '4'). Even in such a case, the PCM cell 110-44 and the PCM cell 110-55 to which the fourth and fifth write operations executed by the fourth and fifth write requests W4 and W5 are successively applied may be coupled to two different word lines and two different bit lines and do not share the same word line and the same bit line.

The sixth write operation executed by the sixth write request W6 may be performed to write a datum into the PCM cell 110-66 coupled to the sixth word line WL5 (corresponding to the word line index Iw of '5') and the sixth bit line BL5 (corresponding to the bit line index Ib of '5'). Even in such a case, the PCM cell 110-55 and the PCM cell 110-66 to which the fifth and sixth write operations executed by the fifth and sixth write requests W5 and W6 are successively applied may be coupled to two different word lines and two different bit lines and do not share the same word line and the same bit line.

As described above, if at least two successive write operations are sequentially applied to at least two adjacent memory cells sharing the same word line (corresponding to any one of the word line indexes Iw of 0, 1, 2, 3, 4, 5, 6, and 7) or the same bit line (corresponding to any one of the bit line indexes Ib of 0, 1, 2, 3, 4, 5, 6, and 7), a write disturbance may occur. Where adjacent memory cells are memory cells which are positioned next to each other and share the same word line or share the same bit line. However, according to the embodiments, the row index Ir before the address distribution may be transformed into the row index Mr after the address distribution using the equation 1. Thus, it may prevent at least two successive write operations from being sequentially applied to at least two adjacent memory cells sharing the same word line or the same bit line. As a result, the occurrence of a write disturbance may be suppressed while write operations of the memory cells are performed.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. An address distribution apparatus comprising:
an address distributor configured to distribute addresses of a plurality of memory cells in a memory device to prevent at least two successive write operations from being applied to at least two adjacent memory cells sharing any one of a plurality of word lines or any one of a plurality of bit lines among the plurality of memory cells,
wherein the at least two write operations are performed in response to write requests outputted from a host, respectively, and
wherein the address distributor includes:
a jump index selector configured to select a jump index which is used to distribute the addresses of the plurality of memory cells; and
an address mapping part configured to perform an address distribution operation using the jump index selected by the jump index selector.

2. The apparatus of claim 1, wherein the memory device is a volatile memory device or a nonvolatile memory device.

3. The apparatus of claim 1, wherein the plurality of memory cells are located at cross points of the plurality of word lines and the plurality of bit lines, respectively.

4. The apparatus of claim 1, wherein the jump index selector selects any one of natural numbers which is greater than the number of the bit lines and is relatively prime to the number of the bit lines, and outputs the selected natural number to the address mapping part.

5. The apparatus of claim 4, wherein the jump index selector randomly selects any one of the natural numbers which is greater than the number of the bit lines and is relatively prime to the number of the bit lines.

6. The apparatus of claim 4, wherein the address mapping part calculates row indexes using the following equation to perform the address distribution operation, $$Mr=(Ir \times J) \bmod Nr$$

wherein, "Mr" denotes the row index after the address distribution operation, "Ir" denotes a row index before the address distribution operation, "J" denotes the jump index selected by the jump index selector, "Nr" denotes the total number of the memory cells, and "mod" denotes a modulo operation that employs a remainder after dividing the value of "Ir×J" into the value of "Nr"

as the row index Mr after address distribution if the value of "Ir×J" is greater than the value of "Nr".

7. The apparatus of claim 6, wherein the row index Ir before the address distribution operation is set by indexing the address of each of the memory cells and is defined by the following equation, $$Ir=(Nb \times Iw)+Ib$$

wherein, "Nb" denotes the number of the bit lines, "Iw" denotes the word line index, and "Ib" denotes the bit line index.

8. The apparatus of claim 7, wherein the word line index Iw is defined as a decimal number of any one of addresses of the word lines, and the bit line index Ib is defined as a decimal number of any one of addresses of the bit lines.

9. An address distribution method comprising:
distributing addresses of a plurality of memory cells in a memory device to prevent at least two successive write operations from being applied to at least two adjacent memory cells sharing any one of a plurality of word lines or any one of a plurality of bit lines among the plurality of memory cells,
wherein the at least two write operations are performed in response to write requests outputted from a host, respectively, and
wherein distributing the addresses of the plurality of memory cells includes:
selecting a jump index which is used to distribute the addresses of the plurality of memory cells; and
performing an address distribution operation using the selected jump index.

10. The method of claim 9, wherein the memory device is a volatile memory device or a nonvolatile memory device.

11. The method of claim 9, wherein the plurality of memory cells are located at cross points of the plurality of word lines and the plurality of bit lines, respectively.

12. The method of claim 9, wherein selecting the jump index includes selecting any one of natural numbers which is greater than the number of the bit lines and is relatively prime to the number of the bit lines.

13. The method of claim 12, wherein selecting the jump index includes randomly selecting any one of the natural numbers which is greater than the number of the bit lines and is relatively prime to the number of the bit lines.

14. The method of claim 12, wherein performing an address distribution operation includes calculating row indexes using the following equation, $$Mr=(Ir \times J) \bmod Nr$$

wherein, "Mr" denotes the row index after the address distribution operation, "Ir" denotes a row index before the address distribution operation, "J" denotes the jump index selected the jump index selector, "Nr" denotes the total number of the memory cells, and "mod" denotes a modulo operation that employs a remainder after dividing the value of "Ir×J" into the value of "Nr" as the row index Mr after address distribution if the value of "Ir×J" is greater than the value of "Nr".

15. The method of claim 14, wherein the row index Ir before the address distribution operation is set by indexing the address of each of the memory cells and is defined by the following equation, $$Ir=(Nb \times Iw)+Ib$$

wherein, "Nb" denotes the number of the bit lines, "Iw" denotes the word line index, and "Ib" denotes the bit line index.

16. The method of claim 15, wherein the word line index Iw is defined as a decimal number of any one of addresses of the word lines, and the bit line index Ib is defined as a decimal number of any one of addresses of the bit lines.

* * * * *